(12) United States Patent
Fann

(10) Patent No.: US 8,227,740 B2
(45) Date of Patent: Jul. 24, 2012

(54) PHOTO DETECTOR DEVICE WITHOUT A STORAGE CAPACITOR AND CONFIGURED FOR DISPLAY DEVICE

(75) Inventor: Sen-Shyong Fann, Taipei County (TW)

(73) Assignee: Integrated Digital Technologies, Inc., Hsinchu (TW)

( * ) Notice: Subject to any disclaimer, the term of this patent is extended or adjusted under 35 U.S.C. 154(b) by 0 days.

(21) Appl. No.: 12/542,702

(22) Filed: Aug. 18, 2009

(65) Prior Publication Data

US 2009/0309009 A1 Dec. 17, 2009

Related U.S. Application Data

(60) Continuation of application No. 12/406,337, filed on Mar. 18, 2009, which is a division of application No. 11/534,680, filed on Sep. 25, 2006, now Pat. No. 7,525,078.

(30) Foreign Application Priority Data

Oct. 7, 2005 (TW) .............................. 94135169 A

(51) Int. Cl.
*H01J 40/14* (2006.01)
*G06M 7/00* (2006.01)

(52) U.S. Cl. ................... 250/214 R; 250/221

(58) Field of Classification Search ............... 250/208.1, 250/214.1, 214 R, 221; 348/272–283, 294–302, 348/333.01; 345/173, 175, 179, 183, 104; 349/12; 178/18.01, 18.03, 18.09
See application file for complete search history.

(56) References Cited

U.S. PATENT DOCUMENTS 7,812,811 B2 * 10/2010 Shih et al. ..................... 345/104
2003/0218116 A1 * 11/2003 Boer ........................... 250/208.1
* cited by examiner

*Primary Examiner* — Pascal M Bui Pho
(74) *Attorney, Agent, or Firm* — Jianq Chyun IP Office

(57) ABSTRACT

A photo detector device for a display device includes many first conductive lines, many second conductive lines orthogonal to the first conductive lines, many switching transistors, and many photosensitive transistors. Each of the switching transistors includes a drain, a source, and a gate, wherein the sources are electrically connected to the second conductive line, the gates are electrically connected to the first conductive line, and the first conductive lines receive a control signal to control on/off states of the switching transistors. Each of the photosensitive transistors includes a drain, a source, and a gate, wherein the photosensitive transistor sources are electrically connected to the drains of the switching transistors, and the photosensitive transistor gates are connected to and maintained at the potential of the photosensitive transistor drains.

18 Claims, 12 Drawing Sheets

PHOTO DETECTOR DEVICE WITHOUT A STORAGE CAPACITOR AND CONFIGURED FOR DISPLAY DEVICE

CROSS-REFERENCE TO RELATED APPLICATION

This application is a continuation application of and claims the priority benefit of patent application Ser. No. 12/406,337, filed on Mar. 18, 2009, entitled "PHOTO DETECTOR ARRAY". The prior patent application Ser. No. 12/406,337 is a divisional application of and claims the priority benefit of patent application Ser. No. 11/534,680, filed on Sep. 25, 2006, which has been patented as U.S. Pat. No. 7,525,078 on Apr. 28, 2009. The prior patent application Ser. No. 11/534,680 also claims the priority benefit of Taiwan application No. 94135169, filed on Oct. 17, 2005. The entirety of each of the above-mentioned applications is hereby incorporated by reference herein and made a part of this specification.

BACKGROUND OF THE INVENTION

1. Technical Field

The disclosure relates to an image sensor, and more particularly, to a photo detector device capable of detecting an image input from a stylus, pen, torch or a shadow.

2. Background

With the rapid development in the high-tech industry, pen tablets have been widely applicable to Personal Digital Assistants (PDAs), Personal Computers (PCs) and other electrical appliances used in our daily life. Generally, a pen tablet includes one of a resistor-type, electromagnetic inductance-type, capacitor-type and optoelectronic-type writing panel. As an example of a conventional optoelectronic-type pen tablet, an optical signal may be converted into electrical charges, which in turn may be stored in a capacitor of a detector array including capacitors, optoelectronic components and switch transistors before it is subsequently read. The capacitors may require additional areas and therefore adversely reduce the aperture ratio of the panel. Furthermore, the charges generated by a background light source and an input signal may be stored in the capacitor, adversely resulting in a relatively narrow dynamic range. It may therefore be desirable to have a photo detector device that is able to convert an optical signal into a photocurrent, thereby eliminating the storing capacitors used in the conventional panels.

SUMMARY

Examples of the invention may provide a photo detector device configured for use with a display device, the photo detector device comprising a plurality of first conductive lines extending in parallel with each other, a plurality of second conductive lines extending in parallel with each other and being orthogonal to the plurality of first conductive lines, a plurality of switching transistors, each being disposed near one of the first conductive lines and one of the second conductive lines and comprising a drain, a source and a gate, wherein the sources are electrically connected to the second conductive line, the gates are electrically connected to the first conductive line, and the first conductive lines receive a control signal to control on/off states of the switching transistors, and a plurality of photosensitive transistors, each being disposed near one of the first conductive lines and one of the second conductive lines and comprising a photosensitive transistor drain, a photosensitive transistor source and a photosensitive transistor gate, wherein the photosensitive transistor sources are electrically connected to the drains of the switching transistors, and the photosensitive transistor gates are connected to and maintained at the potential of the photosensitive transistor drains.

Some examples of the invention may also provide a photo detector device configured for use with a display device, the photo detector device comprising a plurality of first conductive lines extending in parallel with each other, a plurality of second conductive lines extending in parallel with each other and being orthogonal to the plurality of first conductive lines, and a plurality of photosensitive transistors, each being disposed near one of the first conductive lines and one of the second conductive lines and comprising a photosensitive transistor drain, a photosensitive transistor source and a photosensitive transistor gate, wherein the photosensitive transistor gates are electrically connected to the photosensitive transistor drains, which are coupled to the first conductive lines, and the photosensitive transistor sources are electrically connected to the second conductive lines.

It is to be understood that both the foregoing general description and the following detailed description are exemplary and explanatory only and are not restrictive of the invention, as claimed.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1A:
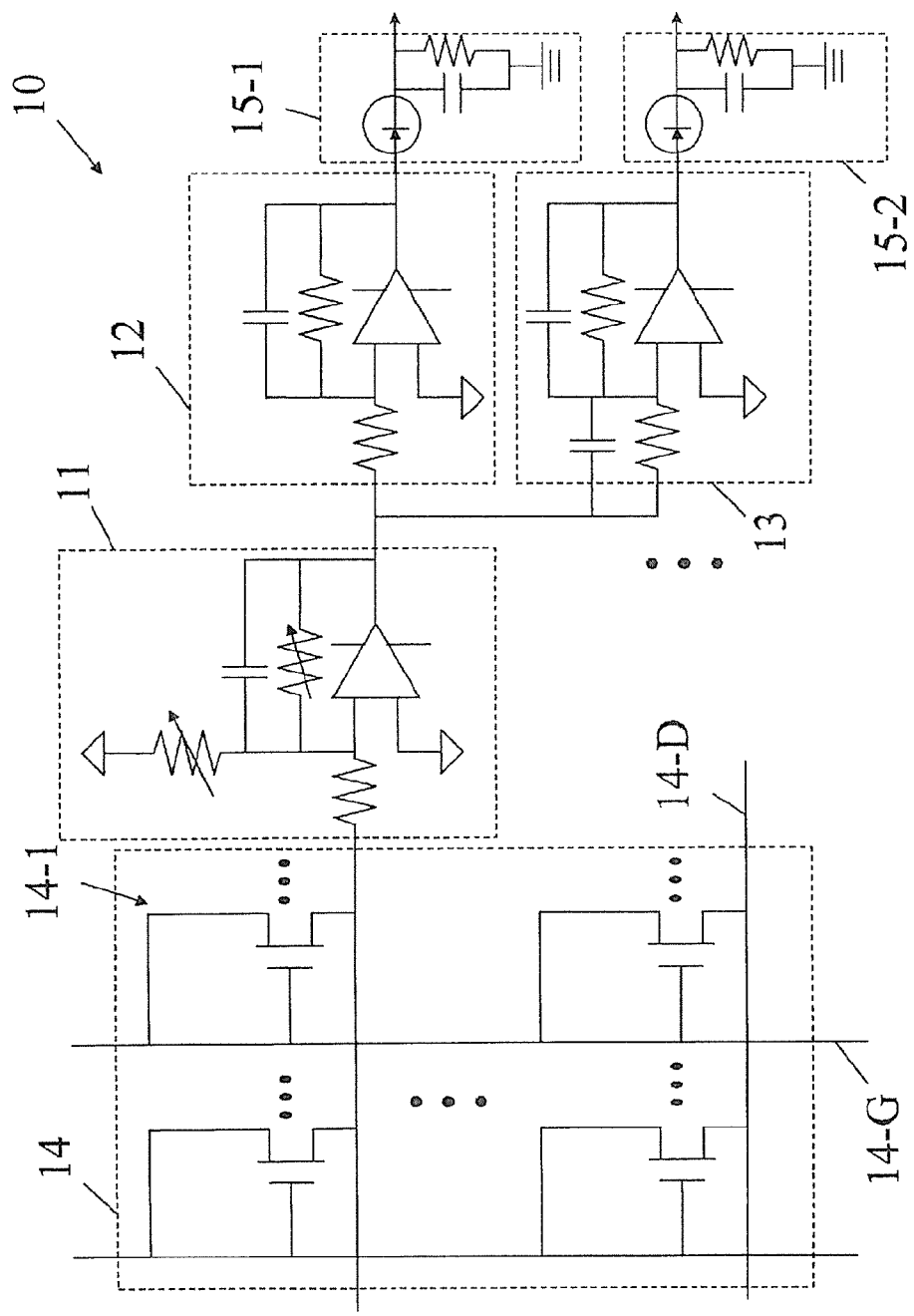
FIG. 1A is a schematic circuit diagram of a photo detector array consistent with an example of the present invention.

FIG. 1A is a schematic circuit diagram of a photo detector array 10 consistent with an example of the present invention. Referring to FIG. 1A, the photo detector array 10 may include a photosensitive transistor array 14, and a first amplifier module 11, a second amplifier module 12 and a third amplifier module 13. The photosensitive transistor array 14 may include a plurality of photosensitive transistors 14-1 formed in rows and columns. A representative photosensitive transistor 14-1 is disposed near an intersection of one of a plurality of gate lines 14-G and one of a plurality of data lines 14-D orthogonal to the gate lines 14-G. Each of the plurality of data lines 14-D is electrically connected to the first amplifier module 11, which in turn is electrically connected to the second amplifier module 12 and the third amplifier module 13 connected in parallel with the second amplifier module 12. The photo detector array 10 may further include a first detector 15-1 and a second detector 15-2, which are electrically connected to the second amplifier module 12 and the third amplifier module 13, respectively.

Figure 1B:
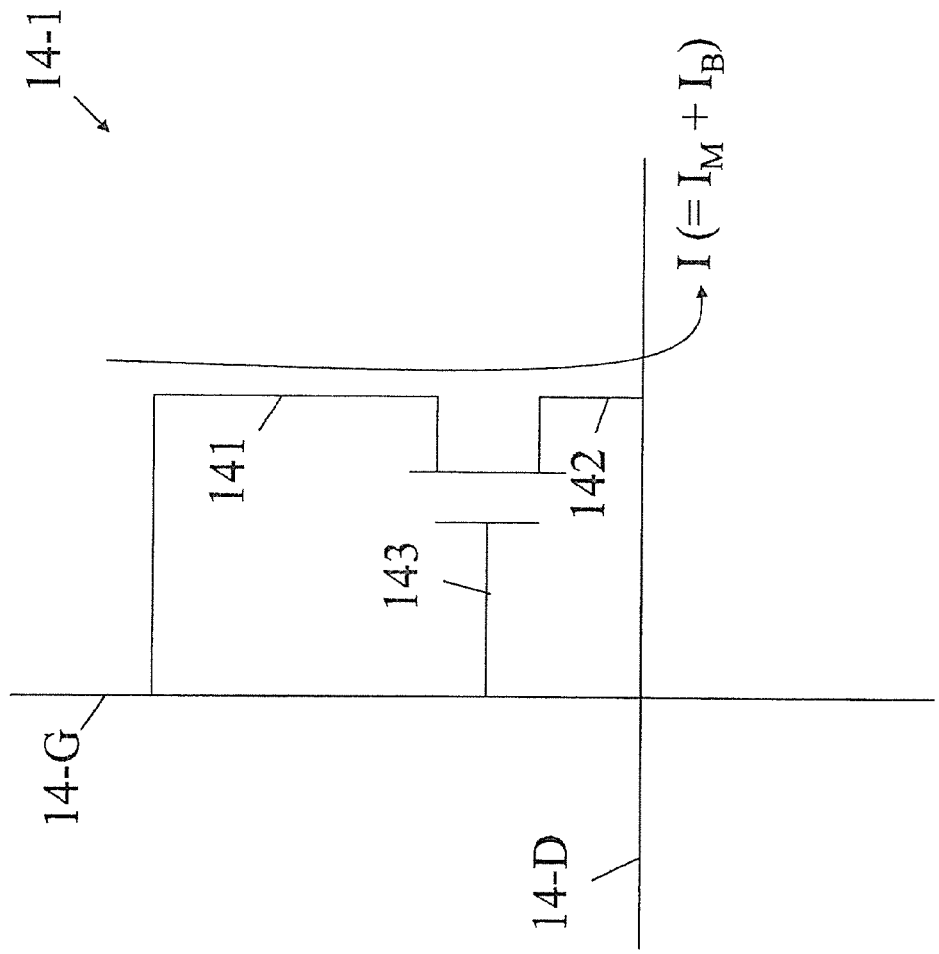
FIG. 1B is an enlarged circuit diagram of a photosensitive transistor of the photo detector array illustrated in FIG. 1A.

FIG. 1B is an enlarged circuit diagram of the photosensitive transistor 14-1 of the photo detector array 10 illustrated in FIG. 1A. The photosensitive transistor 14-1 may function to detect light and serve as a switch. Referring to FIG. 1B, the photosensitive transistor 14-1 may include a first electrode 141, a second electrode 142 and a gate electrode 143. The first electrode 141, which serves as a drain of the photosensitive transistor 14-1, is connected to the gate line 14-G. The second electrode 142, which serves as a source of the photosensitive transistor 14-1, is connected to the data line 14-D. The gate electrode 143 is connected to the gate line 14-G and thus is short-circuited to the first electrode 141, which may advantageously prevent parasitic capacitance from accumulation therebetween. In the absence of an input optical signal provided from, for example, a light source such as a stylus or torch, a pressure source such as a force applied from an ordinary pen or fingertip, or even the shadow of an object, only the background light may be detected by the photosensitive transistor 14-1 if the gate line 14-G is selected. The background light is converted to a photo current $I_B$, which is generally a relatively small current. In the presence of an input optical signal, the photosensitive transistor 14-1 generates a current I if the gate line 14-G is selected. The current I includes an image current $I_M$ due to the input optical signal and the photo current $I_B$ due to the background light. The current I is provided to the first amplifier module 11.

Figure 1C:
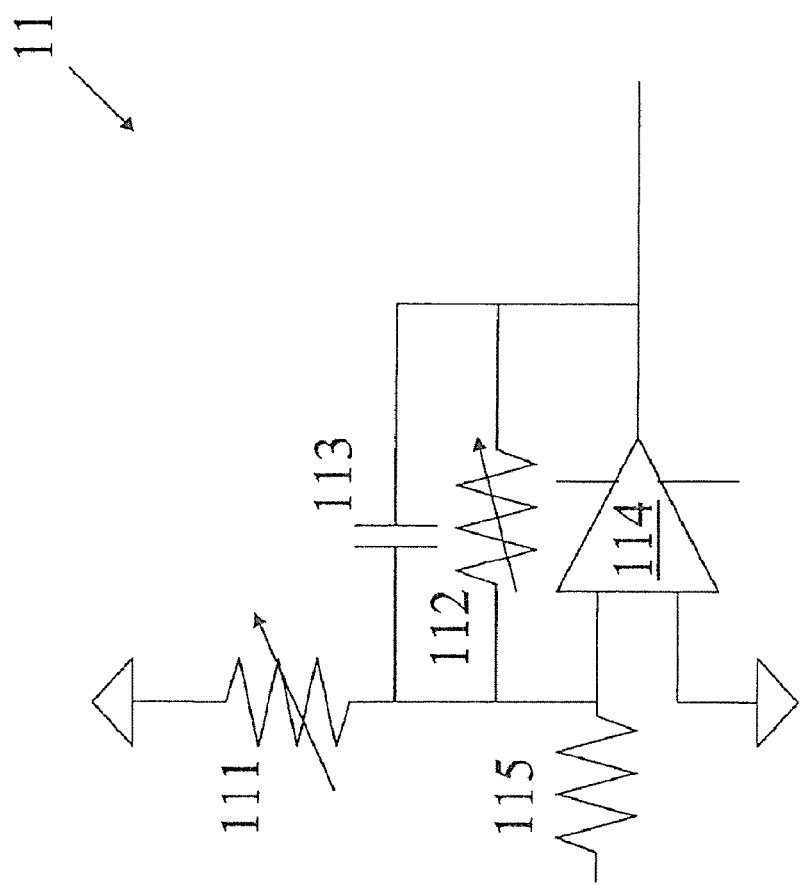
FIG. 1C is an enlarged circuit diagram of a first amplifier module of the photo detector array illustrated in FIG. 1A.

FIG. 1C is an enlarged circuit diagram of the first amplifier module 11 of the photo detector array 10 illustrated in FIG. 1A. Referring to FIG. 1C, the first amplifier module 11 may include a first variable resistor 111, a second variable resistor 112, a capacitor 113, an operational amplifier 114 and a resistor 115. The first amplifier module 11 may function to obtain the image current $I_M$ out of the current I by removing the photo current $I_B$. The resistance of the first variable resistor 111 may vary as the photo current $I_B$ varies. Specifically, the resistance of the first variable resistor 111 may be automatically adjusted in response to the variation in the background light intensity so as to provide differential signal compensation. Therefore, the photo current $I_B$ may be cancelled in the operational amplifier 114 due to a differential amplifier circuit function. As a result, interference caused by the background light may be minimized, which may enhance the system sensitivity and expand the dynamic range of the photo detector array 10.

In the absence of an input optical signal, the first variable resistor 111 may maintain an output voltage of the first amplifier module 11 at a stable level. That is, the gain of the first amplifier module 11 may be designed with a substantially large value (but not infinite) such that the signal response is sensitive enough to determine whether an input optical signal is light or shadow. In one example consistent with the present invention, when an output value is smaller than the level, it is determined that an input optical signal is provided by a light stylus or a light pen. Furthermore, when an output value is greater than the level, it is determined that an input optical signal is provided by a shadow. In another example, when an output value is greater than the level, it is determined that an input optical signal is provided by a light stylus. Furthermore, when an output value is smaller than the level, it is determined that an input optical signal is provided by a shadow. In still another example, the stable level may include a gray scale value "128", given 8 bits per pixel. A relatively white-color optical input signal has a gray scale value ranging from 128 to 255, while a relatively black-color optical input signal has a gray scale value ranging from 0 to 128. The compensation process may thus compensate for the variation in the background light and the differences of optoelectronic characteristics of the plurality of photosensitive transistors 14-1 as well. Consequently, the output voltage of each of the plurality of photosensitive transistors 14-1 of the photo detector array 10 may be maintained at a stable level in the absence of an input optical signal. Therefore, a light stylus may be used as an entry tool. Similarly, the shadow of finger, chopstick or ordinary pen may also serve as an entry tool. In one example, an input optical signal having a diameter of approximately 3 millimeter or greater may be detectable by the photo detector array 10.

Figure 1D:
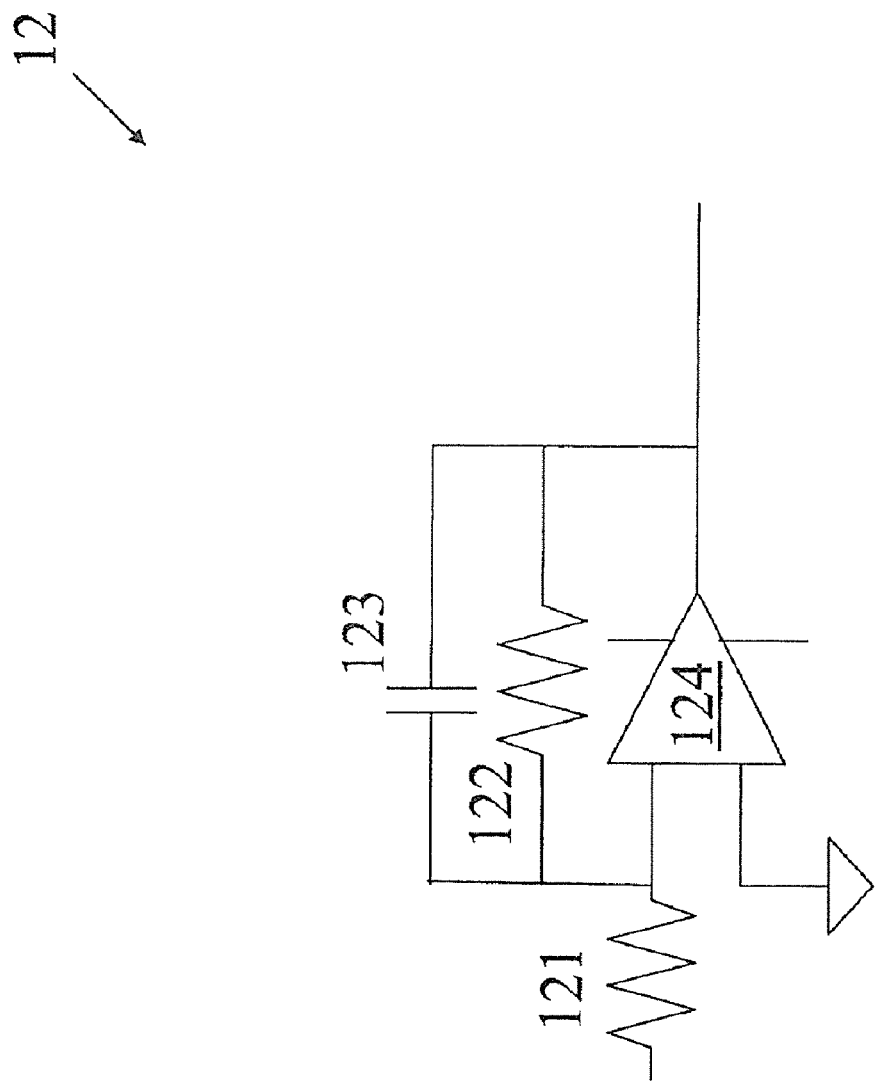
FIG. 1D is an enlarged circuit diagram of a second amplifier module of the photo detector array illustrated in FIG. 1A.

FIG. 1D is an enlarged circuit diagram of the second amplifier module 12 of the photo detector array 10 illustrated in FIG. 1A. Referring to FIG. 1D, the second amplifier module 12 may include a first resistor 121, a second resistor 122, a capacitor 123 and an operational amplifier 124. The second resistor 122 and the capacitor 123 form a low pass filter. The second amplifier module 12 may function to process a direct-current (dc) component of a signal provided by the first amplifier module 11. Specifically, the second amplifier module 12 filters out or attenuates frequencies higher than the cutoff frequency of the low pass filter, thereby reducing the high-frequency noise in the dc component. The dc component is generated by an optical input through, for example, a general stylus, pen, torch, finger or chopstick. In one example consistent with the present invention, the photo detector array 10 may include an analog-to-digital converter electrically connected to the second amplifier module 12 at a subsequent stage to further process the dc component.

Figure 1E:
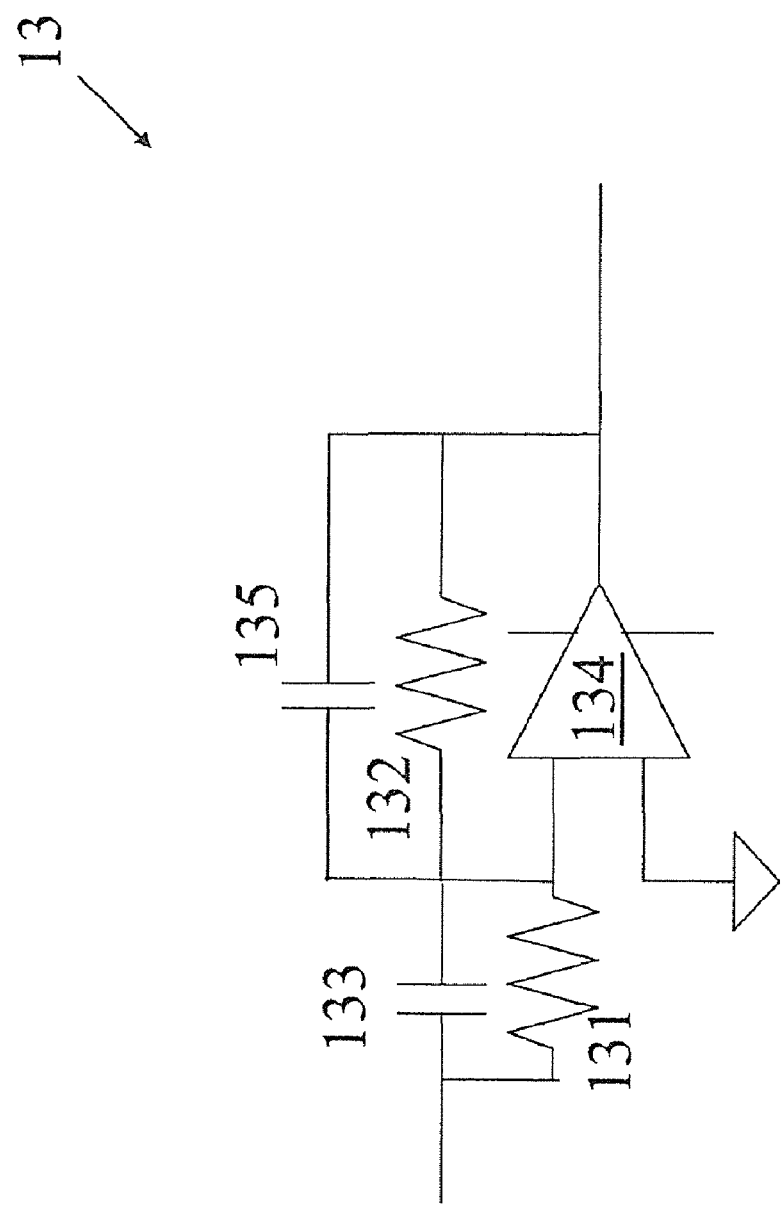
FIG. 1E is an enlarged circuit diagram of a third amplifier module of the photo detector array illustrated in FIG. 1A.

FIG. 1E is an enlarged circuit diagram of the third amplifier module 13 of the photo detector array 10 illustrated in FIG. 1A. Referring to FIG. 1E, the third amplifier module 13 may include a first resistor 131, a second resistor 132, a first capacitor 133, a second capacitor 135 and an operational amplifier 134. The third amplifier module 13 may serve as a band pass filter, and process an alternating-current (ac) component of a signal provided by the first amplifier module 11. The ac component is generated by an optical input through, for example, a dedicated light stylus or light pen having a specific output specification such as frequency. The third amplifier module 13 is able to detect a modulated optical signal from the dedicated light stylus, which converts a force applied therethrough on a panel into a frequency. In one example consistent with the present invention, the photo detector array 10 may include a phase-locked-loop ("PLL")

circuit (not shown) electrically connected to the third amplifier module 13 at a subsequent stage to convert the frequency of the dedicated light stylus into a voltage signal.

Referring back to FIG. 1A, each of the first detector 15-1 and the second detector 15-2 may include a diode (not numbered) and a low pass filter (not numbered) connected in parallel with the diode. The second detector 15-2 may be able to detect the amplitude of the signal from the third amplifier module 13.

Figure 2A:
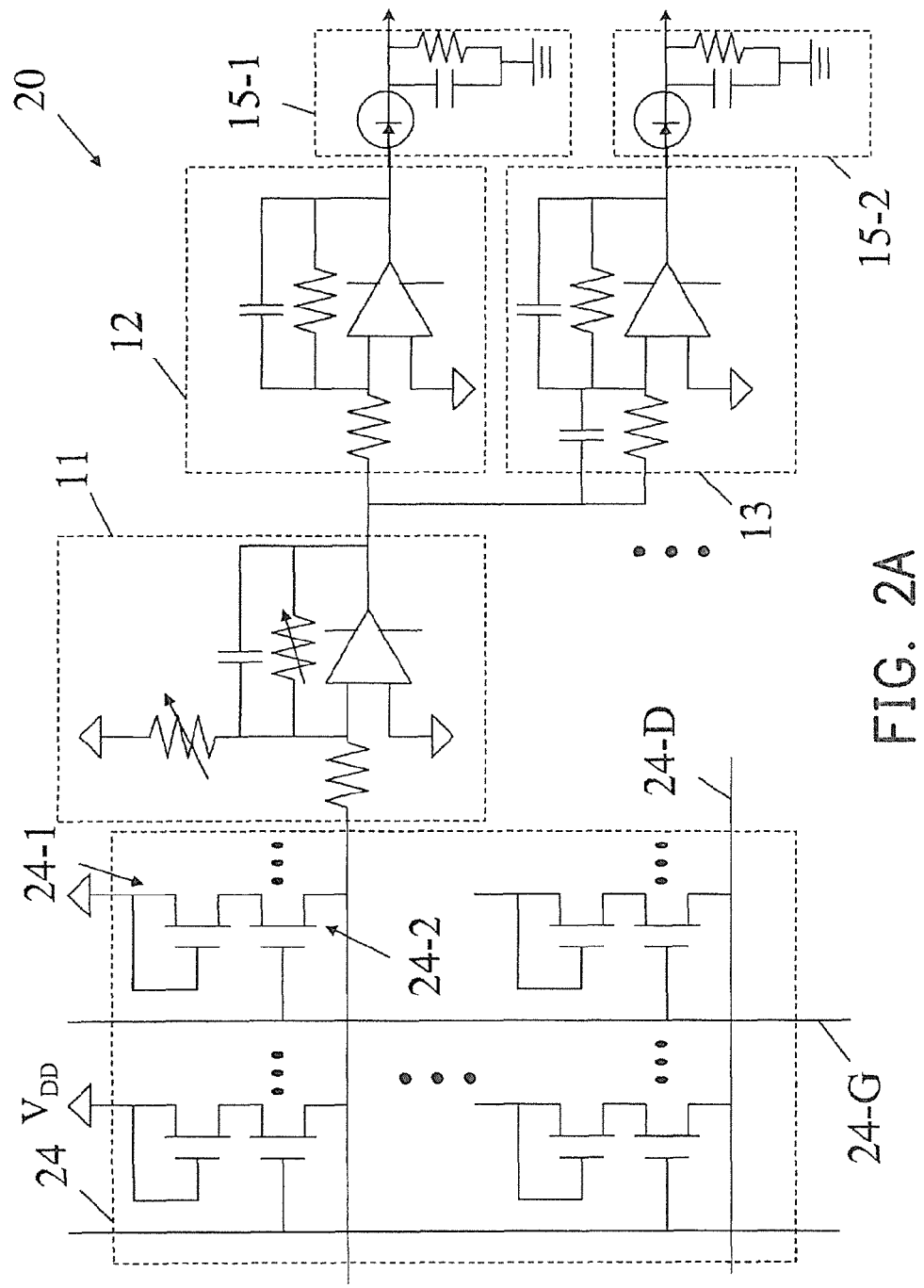
FIG. 2A is a schematic diagram of a photo detector array consistent with another example of the present invention.

FIG. 2A is a schematic diagram of a photo detector array 20 consistent with another example of the present invention. Referring to FIG. 2A, the photo detector array 20 may be similar to the photo detector array 10 illustrated in FIG. 1A except, for example, a photosensitive transistor array 24 replaces the photosensitive transistor array 14. The photosensitive transistor array 24 may include a plurality of photosensitive transistors 24-1 and a plurality of switching transistors 24-2 formed in rows and columns. A representative photosensitive transistor 24-1 and a representative switching transistor 24-2 are disposed near an intersection of one of a plurality of gate lines 24-G and one of a plurality of data lines 24-D orthogonal to the gate lines 24-G.

Figure 2B:
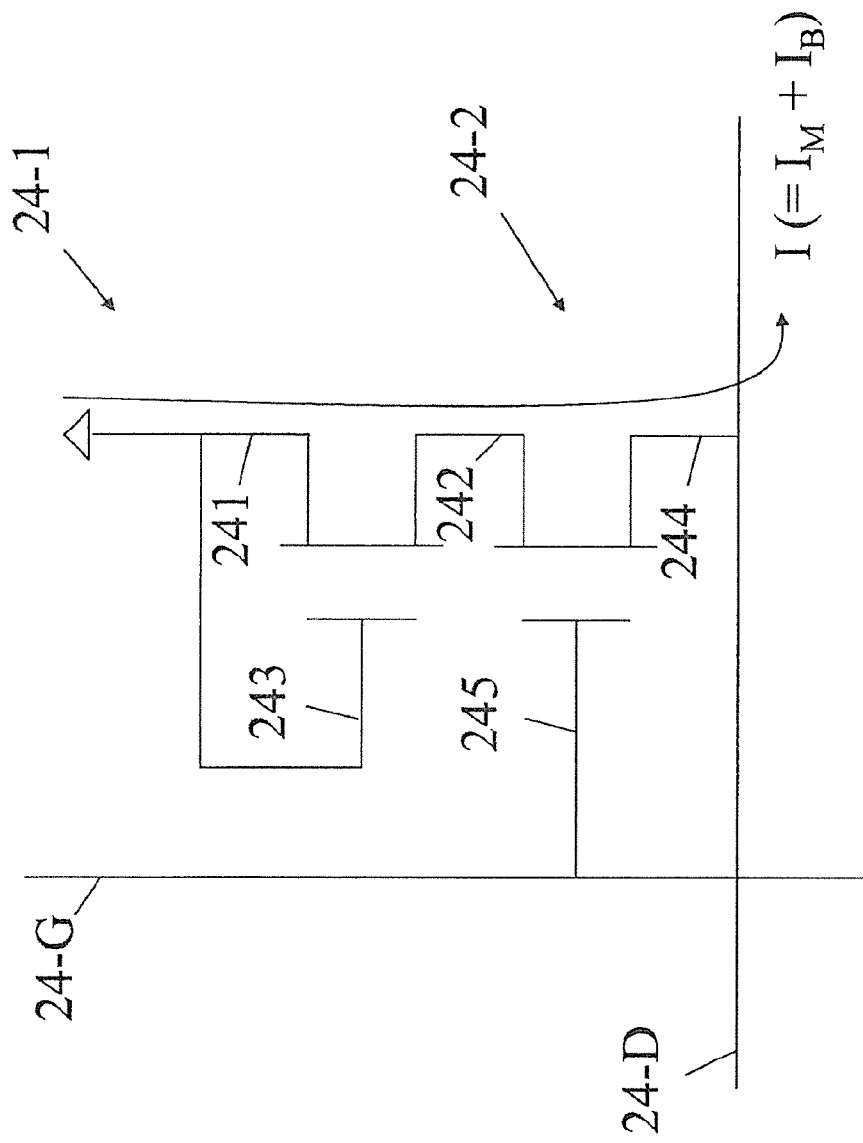
FIG. 2B is an enlarged circuit diagram of a photosensitive transistor and a switching transistor of the photo detector array illustrated in FIG. 2A.

FIG. 2B is an enlarged circuit diagram of the photosensitive transistor 24-1 and the switching transistor 24-2 of the photo detector array 20 illustrated in FIG. 2B. Referring to FIG. 2B, the photosensitive transistor 24-1 may include a first electrode 241, a second electrode 242 and a gate electrode 243, which serve as a drain, source and gate of the photosensitive transistor 24-1, respectively. The first electrode 241 and the gate electrode 243 are short-circuited to prevent parasitic capacitance from accumulation therebetween. The switching transistor 24-2 may include a first electrode 242, a second electrode 244 and a gate electrode 245, which serve as a drain, source and gate of the switching transistor 24-2, respectively. The gate electrode 245 is connected to the gate line 24-G, and the second electrode 244 is connected to the data line 24-D.

In the absence of an input optical signal provided from, for example, a stylus, an ordinary pen, a torch, a fingertip or even the shadow of an object, only the background light may be detected by the photosensitive transistor 24-1 if the gate line 24-G is selected, which turns on the switching transistor 24-2 and the photosensitive transistor 24-1. The background light may be converted to a photo current $I_B$. In the presence of an input optical signal, the photosensitive transistor 24-1 generates a current I if the gate line 24-G is selected. The current I includes an image current $I_M$ due to the input optical signal and the photo current $I_B$ due to the background light. The current I is provided to the first amplifier module 11.

Figure 2C:
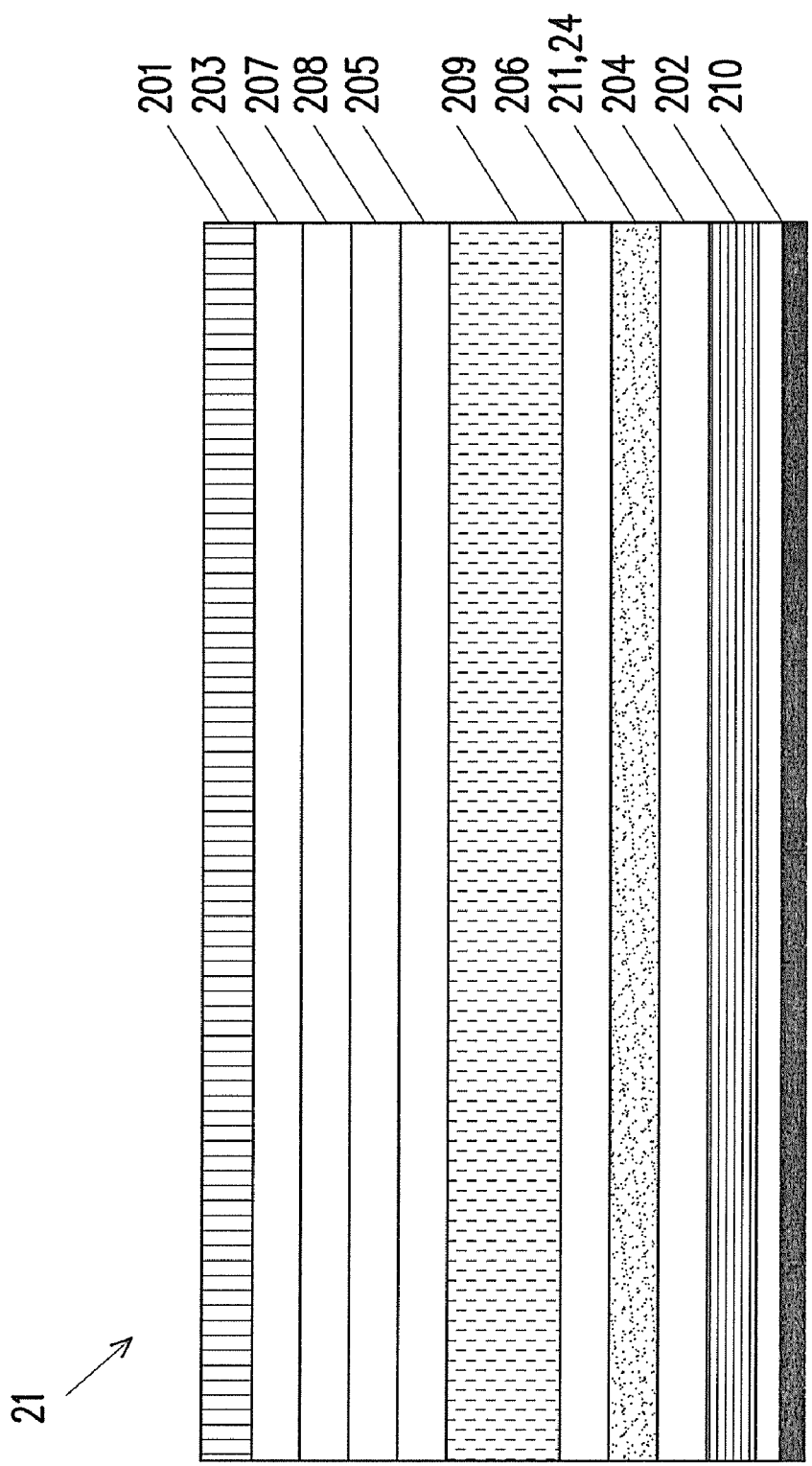
FIG. 2C is a schematic cross-sectional diagram of a photo detector array incorporated in a thin film transistor liquid crystal display panel consistent with an example of the present invention.

FIG. 2C is a schematic cross-sectional diagram of the photo detector array 24 incorporated in a thin film transistor liquid crystal display panel 21 consistent with an example of the present invention. Referring to FIG. 2C, the panel 21 may include a pair of polarizers 201, 202, a pair of glass substrates 203, 204, a pair of alignment films 205, 206, a color filter film 207, a common electrode 208, a liquid crystal cell 209, a backlight unit 210 and a thin film transistor ("TFT") layer 211. The photo detector array 24 may be formed in the TFT layer 211. In one example consistent with the present invention, the gate lines 24-G illustrated in FIG. 2B serve as a portion of gate lines for switching transistors in the TFT layer 211.

Figure 3A:
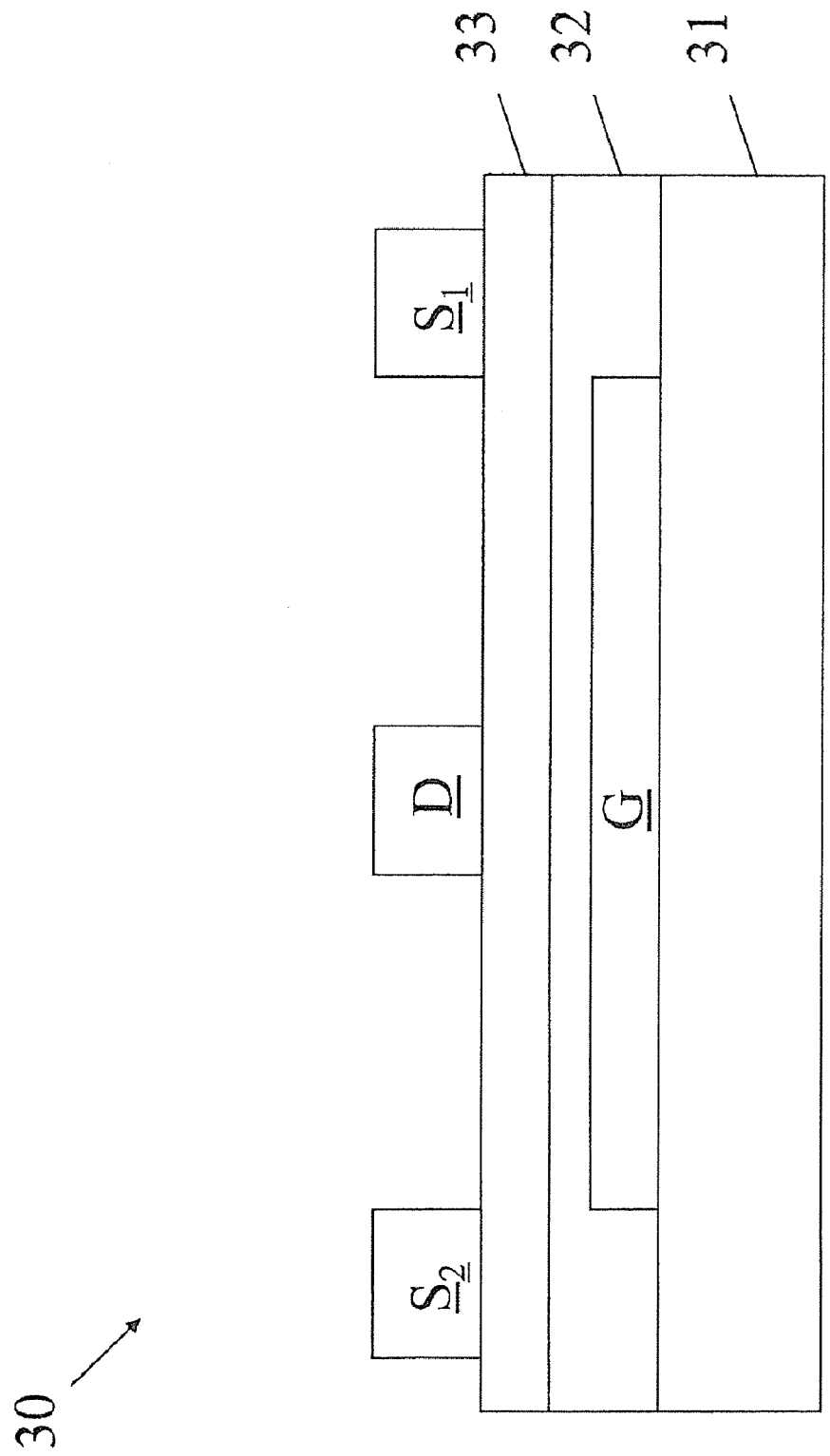
FIGS. 3A and 3B are respectively a cross-sectional view and a top view of a photo detector device consistent with examples of the present invention.
Figures 3B, 3C:
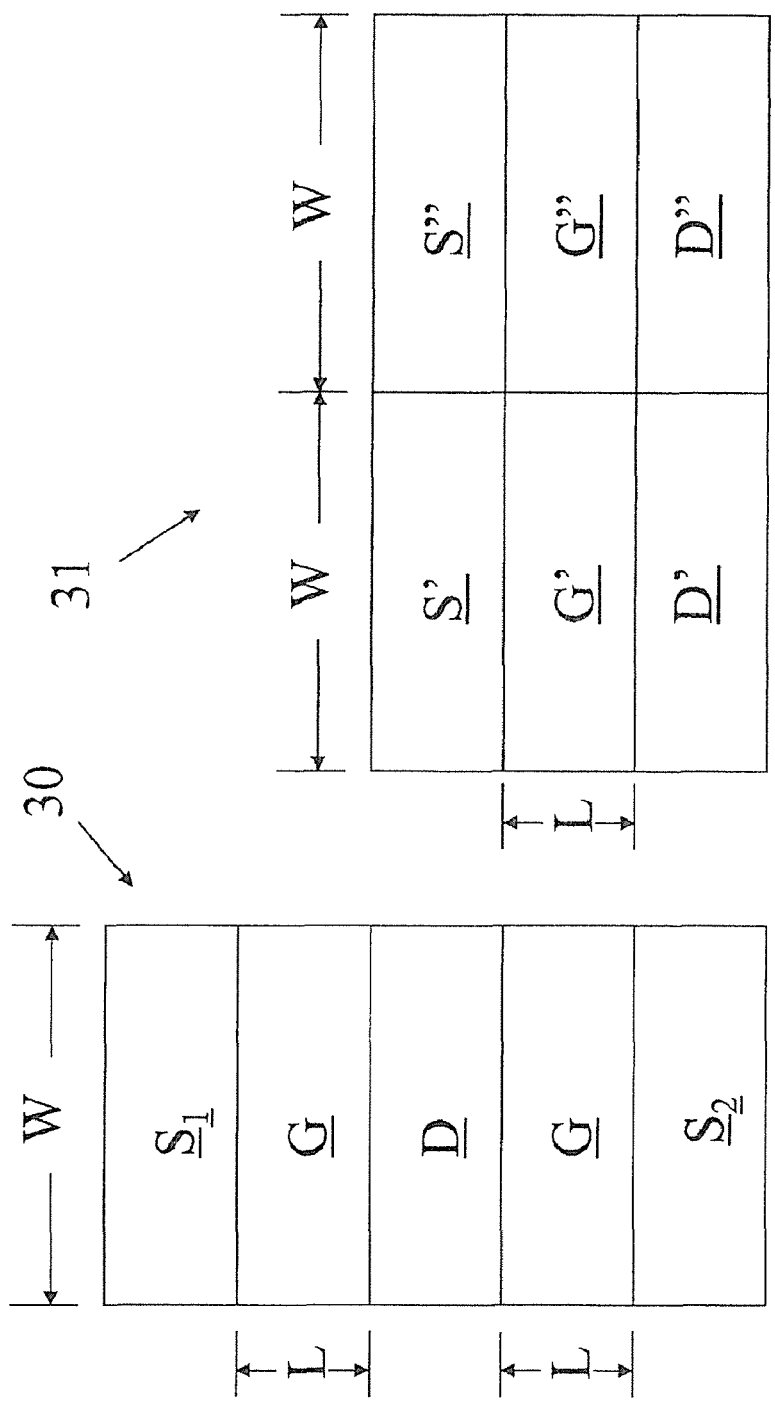
FIG. 3C is a top view of a conventional photo detector device.

FIGS. 3A and 3B are respectively a cross-sectional view and a top view of a photo detector device 30 consistent with examples of the present invention. Referring to FIG. 3A, the photo detector device 30 may include a substrate 31, a gate electrode "G" over the substrate 31, an insulating layer 32 over the gate electrode G, a semiconductor layer 33 over the insulating layer 32, and a first source electrode "$S_1$", a drain electrode "D" and a second source electrode "$S_2$" over the semiconductor layer 33. To avoid accumulation of parasitic capacitance, the drain electrode D and the gate electrode G may be coupled to one another as illustrated in FIG. 1A. In the present example, the gate electrode G is aligned with the first source electrode $S_1$ and the second source electrode $S_2$. In other examples, the gate electrode G may cross over a portion of the first source electrode $S_1$ or the entire first source electrode $S_1$. Similarly, the gate electrode G may cross over a portion of the second source electrode $S_2$ or the entire second source electrode S2. Referring to FIG. 3B, the photo detector device 30 may include two channel widths "W" and therefore two folds of channel width-to-length ratio, i.e., 2 (W/L), L being the channel length, in five unit areas, each of which is substantially equal to a source or drain electrode area.

FIG. 3C is a top view of a conventional photo detector device 31. To achieve the same two folds of channel width-to-length ratio, a total number of six unit areas are required in the conventional photo detector device 31, including a first channel width defined by a first set of source, drain and gate electrodes S', D' and G', respectively, and a second channel width defined by a second set of source, drain and gate electrodes S", D" and G", respectively. By comparison, the photo detector device 30 illustrated in FIG. 3A or 3B is more area effective than the conventional photo detector device 31.

Figure 4A:
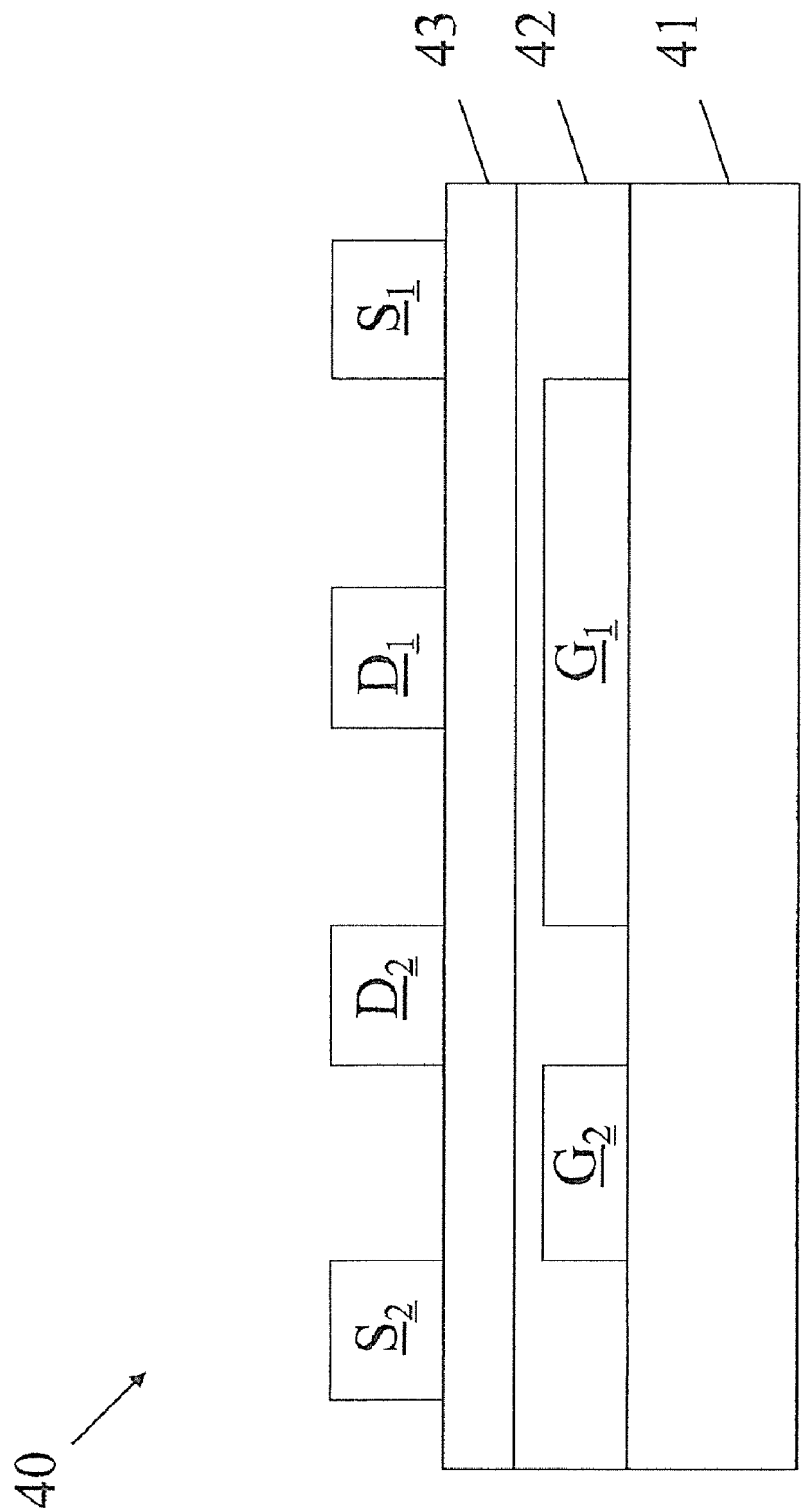
FIGS. 4A and 4B are respectively a cross-sectional view and a top view of a photo detector device consistent with examples of the present invention.
Figures 4B, 4C:
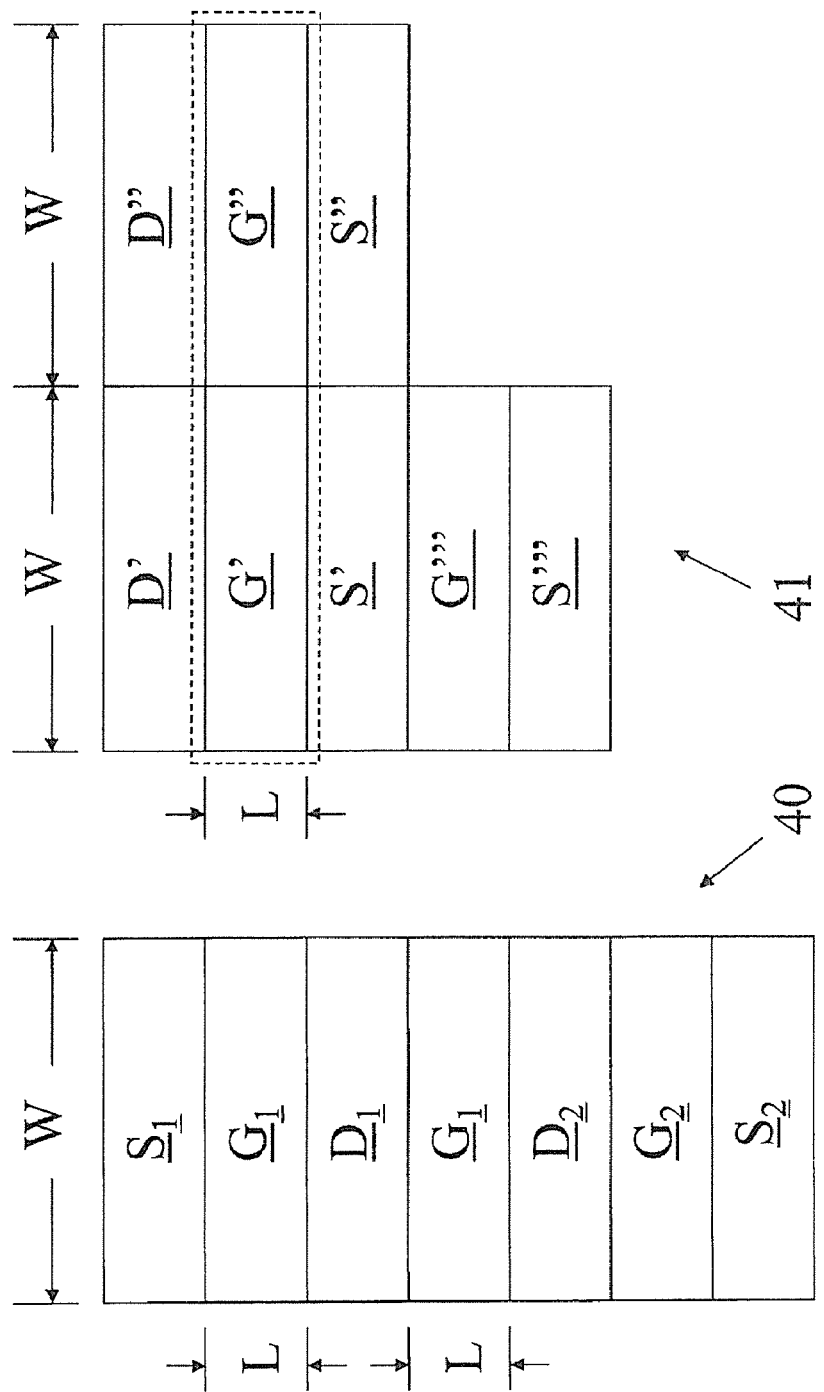
FIG. 4C is a top view of another conventional photo detector device.

FIGS. 4A and 4B are respectively a cross-sectional view and a top view of a photo detector device 40 consistent with examples of the present invention. Referring to FIG. 4A, the photo detector device 40 may include a substrate 41, a first gate electrode "$G_1$" and a second gate electrode "$G_2$" over the substrate 41, an insulating layer 42 over the gate electrodes $G_1$ and $G_2$, a semiconductor layer 43 over the insulating layer 42, and a first source electrode "$S_1$", a first drain electrode $D_1$, a second drain electrode $D_2$ and a second source electrode $S_2$ over the semiconductor layer 43. The first gate electrode $G_1$ and the second gate electrodes $G_2$ are the gates of a photosensitive transistor and a switching transistor, respectively. To avoid accumulation of parasitic capacitance, the first drain electrode $D_1$ and the first gate electrode $G_1$ may be coupled to one another as illustrated in FIG. 2A. The first gate electrode $G_1$ may overlap the first source electrode $S_1$ or the second drain electrode $D_2$ or both. The second gate electrode $G_2$ is aligned with the second source electrode $S_2$ and the second drain electrode $D_2$. In other examples, however, the second gate electrode $G_2$ may cross over a portion of the second source electrode $S_2$ or the entire second source electrode $S_2$. Similarly, the second gate electrode $G_2$ may cross over a portion of the second drain electrode $D_2$ or the entire second drain electrode $D_2$. Referring to FIG. 4B, the photo detector device 40 includes two channel widths "W" and therefore two folds of channel width-to-length ratio, i.e., 2 (W/L), in seven unit areas.

FIG. 4C is a top view of another conventional photo detector device 41. To achieve the same two folds of channel width-to-length ratio, a total number of eight unit areas are required in the conventional photo detector device 41, including a first channel width defined by a first set of source, drain and gate electrodes S', D' and G', respectively, and a second channel width defined by a second set of source, drain and gate electrodes S", D" and G", respectively. A third transistor including S', G'" and S'" serves as a switching transistor. By comparison, the photo detector device 40 illustrated in FIG. 4A or 4B is more area effective than the conventional photo detector device 41.

It will be apparent to those skilled in the art that various modifications and variations can be made to the structure of the embodiment without departing from the scope or spirit of the embodiment. In view of the foregoing, it is intended that the present invention cover modifications and variations of this invention provided they fall within the scope of the following claims and their equivalents.

What is claimed is:

1. A photo detector device configured for use with a display device, the photo detector device comprising:
   a plurality of first conductive lines extending in parallel with each other;
   a plurality of second conductive lines extending in parallel with each other, wherein the plurality of first conductive lines is orthogonal to the plurality of second conductive lines;
   a plurality of switching transistors, each of the switching transistors being disposed near one of the first conductive lines and one of the second conductive lines and comprising:
      a drain;
      a source; and
      a gate;
      wherein the sources are electrically connected to the second conductive line, the gates are electrically connected to the first conductive line, and the first conductive lines receive a control signal to control on/off states of the switching transistors; and
   a plurality of photosensitive transistors, each of the photosensitive transistors being disposed near one of the first conductive lines and one of the second conductive lines and comprising:
      a photosensitive transistor drain;
      a photosensitive transistor source; and
      a photosensitive transistor gate;
      in each of the photosensitive transistors, the photosensitive transistor source is electrically connected to one of the drains of the switching transistors, and the photosensitive transistor gate is connected to and maintained at the potential of the photosensitive transistor drain, without a storage capacitor physically between the photosensitive transistor source and the photosensitive transistor drain.

2. The photo detector device of claim 1, wherein an optical signal is transmitted through the second conductive lines with the switching transistors being turned on.

3. The photo detector device of claim 2, wherein a current generated when the photosensitive transistors is irradiated by an incident light is output from output ends of the second conductive lines.

4. The photo detector device of claim 1, wherein some of the first conductive lines are shared or used as gate lines of the display device.

5. The photo detector device of claim 1, wherein the plurality of the second conductive lines are connected to a sensing circuit.

6. The photo detector device of claim 1, wherein the photosensitive transistors are capable of converting an optical signal into a current.

7. The photo detector device of claim 6, wherein the optical signal is generated by at least one of a light source emitting light and a shadow of an object.

8. The photo detector device of claim 1, wherein some of the second conductive lines are shared or used as data lines of the display device.

9. A photo detector device configured for use with a display device, the photo detector device comprising:
   a plurality of first conductive lines extending in parallel with each other;
   a plurality of second conductive lines extending in parallel with each other, wherein the plurality of first conductive lines are orthogonal to the plurality of second conductive lines; and
   a plurality of photosensitive transistors, each of the photosensitive transistors being disposed near one of the first conductive lines and one of the second conductive lines and comprising:
      a photosensitive transistor drain;
      a photosensitive transistor source; and
      a photosensitive transistor gate;
      in each of the photosensitive transistors, the photosensitive transistor gate is electrically connected to the photosensitive transistor drain, which are coupled to one of the first conductive lines, and the photosensitive transistor source is electrically connected to one of the second conductive lines, without a storage capacitor physically between the photosensitive transistor source and the photosensitive transistor drain.

10. The photo detector device of claim 9, wherein an optical signal is transmitted through the second conductive lines with the switching transistor being turned on.

11. The photo detector device of claim 10, wherein a current generated when the photosensitive transistors is irradiated by an incident light is output from output ends of the second conductive lines.

12. The photo detector device of claim 9, wherein some of the first conductive lines may be shared or used as gate lines of the display device.

13. The photo detector device of claim 9, wherein the plurality of the second conductive lines are connected to a sensing circuit.

14. The photo detector device of claim 9, wherein the photosensitive transistors are capable of converting an optical signal into a current.

15. The photo detector device of claim 14, wherein the optical signal is generated by a light source emitting light or by a shadow of an object.

16. The photo detector device of claim 9, wherein some of the second conductive lines are shared or used as data lines of the display device.

17. A photo detector device configured for use with a display device and in response to an input optical signal, the photo detector device comprising:
   a plurality of first conductive lines extending in parallel with each other;
   a plurality of second conductive lines extending in parallel with each other, wherein the plurality of first conductive lines is orthogonal to the plurality of second conductive lines;
   a plurality of switching transistors, each of the switching transistors being disposed near one of the first conductive lines and one of the second conductive lines and comprising:
      a drain;
      a source; and
      a gate;
      wherein the sources are electrically connected to the second conductive line, the gates are electrically connected to the first conductive line, and the first conductive lines receive a control signal to control on/off states of the switching transistors; and
   a plurality of photosensitive transistors, each of the photosensitive transistors being disposed near one of the first conductive lines and one of the second conductive lines and comprising:
      a photosensitive transistor drain;

a photosensitive transistor source; and
a photosensitive transistor gate;
in each of the photosensitive transistors, the photosensitive transistor source is electrically connected to one of the drains of the switching transistors, and the photosensitive transistor gate is connected to the photosensitive transistor drain,
wherein the input optical signal is not stored in a storage capacitor.

18. A photo detector device configured for use with a display device and in response to an input optical signal, the photo detector device comprising:
a plurality of first conductive lines extending in parallel with each other;
a plurality of second conductive lines extending in parallel with each other, wherein the plurality of first conductive lines is orthogonal to the plurality of second conductive lines;
a plurality of switching transistors, each of the switching transistors being disposed near one of the first conductive lines and one of the second conductive lines and comprising:
a drain;
a source; and
a gate;
wherein the sources are electrically connected to the second conductive line, the gates are electrically connected to the first conductive line, and the first conductive lines receive a control signal to control on/off states of the switching transistors, and the drains are electrically connected to the second conductive line; and
a plurality of photosensitive transistors, each of the photosensitive transistors being disposed near one of the first conductive lines and one of the second conductive lines and comprising:
a photosensitive transistor drain;
a photosensitive transistor source; and
a photosensitive transistor gate;
in each of the photosensitive transistors, the photosensitive transistor source is electrically connected to one of the drains of the switching transistors, and the photosensitive transistor gate is connected to the photosensitive transistor drain,
wherein the input optical signal does not pass a substantial storage capacitor to one of the second conductive lines.

\* \* \* \* \*